(12) United States Patent
Ogura et al.

(10) Patent No.: US 6,506,662 B2
(45) Date of Patent: Jan. 14, 2003

(54) METHOD FOR FORMING AN SOI SUBSTRATE BY USE OF A PLASMA ION IRRADIATION

(76) Inventors: Atsushi Ogura, c/o NEC Corporation, 7-1, Shiba 5-chome, Minato-ku, Tokyo (JP); Youichirou Numasawa, c/o NEC Corporation, 7-1, Shiba 5-chome, Minato-ku, Tokyo (JP); Akira Doi, c/o Nissin Electric Co., Ltd., 47, Umezu-takase-cho, Ukyo-ku, Kyoto-shi, Kyoto (JP); Masayasu Tanjyo, c/o Nissin Electric Co., Ltd., 47, Umezu-takase-cho, Ukyo-ku, Kyoto-shi, Kyoto (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/501,532

(22) Filed: Feb. 9, 2000

(65) Prior Publication Data

US 2002/0155679 A1 Oct. 24, 2002

Related U.S. Application Data

(63) Continuation of application No. 08/719,964, filed on Sep. 24, 1996.

(30) Foreign Application Priority Data

Sep. 25, 1995 (JP) ................................ 7-245636

(51) Int. Cl.$^7$ ................................ H01L 21/76
(52) U.S. Cl. .................. 438/423; 438/404; 438/474; 438/480
(58) Field of Search .................. 438/355, 378, 438/404, 423, 473, 474, 480, 455, 475, 513, 729, 515, 407, 535, 788, 798

(56) References Cited

U.S. PATENT DOCUMENTS

| | | |
|---|---|---|
| 3,976,511 A | 8/1976 | Johnson |
| 4,331,486 A | 5/1982 | Chenevas-Paule et al. |
| 4,465,529 A | 8/1984 | Arima et al. |
| 4,595,601 A | 6/1986 | Horioka et al. |
| 4,891,118 A | 1/1990 | Ooiwa et al. |
| 4,915,979 A | 4/1990 | Ishida et al. |
| 4,987,102 A | 1/1991 | Nguyen et al. |
| 5,133,830 A | 7/1992 | Asaka |

(List continued on next page.)

FOREIGN PATENT DOCUMENTS

| | | |
|---|---|---|
| JP | 63-156535 | 6/1988 |
| JP | 1-207930 | 8/1989 |
| JP | 2-274879 | 11/1990 |
| JP | 2-277776 | 11/1990 |
| JP | 3-214620 | 9/1991 |
| JP | 3-255622 | 11/1991 |
| JP | 7-106512 | 4/1995 |

OTHER PUBLICATIONS

Y. Ishikawa et al., "Preparation of Thin Silicon–on–Insulator Films by Low–Energy Oxygen Ion Implementation", pp. 2427–2431, Japanese Journal of Applied Physics, vol. 30, No. 10, Oct. 1991.

Primary Examiner—Olik Chaudhuri
Assistant Examiner—Jack Chen

(57) ABSTRACT

A method for forming a silicon on insulator substrate includes the step of dissociating a plasma of molecules including at least any one of oxygen and nitrogen to obtain ions. The ions are accelerated by passage through gaps between acceleration electrodes at a predetermined acceleration energy for irradiation of the accelerated ions onto a silicon substrate which is heated to form an insulation film within the silicon substrate.

15 Claims, 2 Drawing Sheets

60 : ring-shaped high frequency electrode
10 : plasma vacuum chamber
70 : ring-shaped high frequency electrode
20 : acceleration electrode
30 : reaction chamber
40 : Si substrate
50 : heater

U.S. PATENT DOCUMENTS

| | | |
|---|---|---|
| 5,145,554 A | 9/1992 | Seki et al. |
| 5,275,798 A | 1/1994 | Aida |
| 5,403,630 A | 4/1995 | Matsui et al. |
| 5,458,919 A | 10/1995 | Okano et al. |
| 5,508,227 A | 4/1996 | Chan et al. |
| 5,571,576 A | 11/1996 | Qian et al. |
| 5,640,020 A | 6/1997 | Murakoshi et al. |
| 5,661,043 A | 8/1997 | Rissman et al. |
| 5,753,564 A | 5/1998 | Fukada |
| 5,763,018 A | 6/1998 | Sato |
| 5,795,813 A | 8/1998 | Hughes et al. |
| 5,796,116 A | 8/1998 | Nakata et al. |

110 : plasma source
120 : mass separator
130 : ion-implantation chamber
140 : Si substrate 60 : ring-shaped high frequency electrode
10 : plasma vacuum chamber
70 : ring-shaped high frequency electrode
20 : acceleration electrode
30 : reaction chamber
40 : Si substrate
50 : heater

METHOD FOR FORMING AN SOI SUBSTRATE BY USE OF A PLASMA ION IRRADIATION

CROSS-REFERENCE TO RELATED APPLICATIONS

This application is a continuation of copending application Ser. No. 08/719,964, filed Sep. 24, 1996.

BACKGROUND OF THE INVENTION

The present invention relates to a method and apparatus for forming a silicon on insulator substrate suitable for high performance semiconductor integrated circuits.

Separation by implanted oxygen method is one of the conventional methods for fabricating the silicon on insulator substrate disclosed in Journal of Material Research, Vol. 8, No. 3 pp. 523–534, 1993. According to this separation by implanted oxygen method, various kinds of ions are generated in an ion source and then subjected to mass separation by a mass separator to separate oxygen ions O+ from the various kinds of ions. The separated oxygen ions O+ are then implanted at a high dose into a silicon substrate. Subsequently, the oxygen ion implanted substrate is subjected to a heat treatment to form a continuous silicon dioxide film within the silicon substrate.

FIG. 1 is a schematic view illustrative of an ion-implantation apparatus used in the conventional method for forming the silicon on insulator substrate. The ion-implantation apparatus comprises a plasma generator 110 for generating various kinds of ions, a mass separator 120 coupled to the plasma generator 110 for separating oxygen ions O+ from the various kinds of ions generated d an ion-implantation chamber coupled to the mass separator 120 for accommodating and scanning a silicon substrate 140 to implant accelerated oxygen ions O+ into the silicon substrate 140. The acceleration of the separated oxygen ions O+ prior to the implantation into the silicon substrate is made at an acceleration voltage in the range of 60 kV to 200 kV. The accelerated oxygen ions O+ are implanted into the silicon substrate 140 at a dose in the range of $2\times10^{17}$ atoms/cm$^2$ to $2\times10^{18}$ atoms/cm$^2$.

The use of the above separation by implanted oxygen method makes it relatively easy to form a thin film silicon insulator substrate, wherein a silicon active layer overlying the silicon dioxide layer has a thickness of not more than 0.5 micrometers. However, the above separation by implanted oxygen method requires the oxygen ion-implantation of one hundred times the number of oxygen ions as compared to that of the normal ion-implantation process. This means that the above separation by implanted oxygen method requires a longer time for the oxygen ion implantation process. In order to shorten such longer time for the oxygen ion implantation process, a high performance ion implantation apparatus has been developed which is expensive. This increases manufacturing cost of the silicon on insulator substrate thereby increasing the price of the silicon on insulator substrate.

In the Japanese laid-open patent publication No. 4-249323, there is disclosed a method for forming a buried insulation layer in the silicon substrate, wherein a silicon dioxide layer as the buried insulation layer has a planerized interface with the silicon layer overlying this buried insulation layer. This is made as follows. First oxygen ions are implanted into a main face of the silicon substrate at a first high energy so that the distribution in density of oxygen implanted has a maximum value at a position deeper than the surface of the silicon substrate. The oxygen implanted substrate is then subjected to a heat treatment to form a silicon dioxide layer at a lower level than the surface level in this silicon substrate. Further, second oxygen ions are implanted into the main face of the silicon substrate at a second high energy which is lower than the first high energy so that the distribution in density of oxygen implanted has a maximum value at a position in the vicinity of the interface between the silicon dioxide layer formed by the above first ion-implantation process and the silicon layer overlying the silicon dioxide layer. The oxygen implanted substrate is then subjected to a heat treatment.

In the Japanese laid-open patent publication No. 4-356960, there is disclosed a method for forming a silicon on insulator substrate having a thin silicon monocrystal layer of a uniform thickness, which is almost free of crystal defects. This method is carried out as follows. Oxygen ions are implanted into a silicon wafer having a uniform and thin thickness before another silicon wafer is combined with this oxygen-implanted surface of the above silicon wafer with a heat treatment to thereby form a silicon dioxide film in the combined silicon wafer.

In the Japanese laid-open patent publication No. 5-275048, there is disclosed an oxygen ion implantation method which enables free control of a surface silicon layer and allows an additional formation of a high quality silicon layer as well which is capable of formation of a multiple layered silicon on insulator structure. A monocrystal silicon wafer is introduced into a vacuumed ion implantation chamber and then heated by a silicon wafer heater. Silicon atoms are evaporated from a silicon source whereby a monocrystal silicon layer is grown in vapor phase growth on the heated silicon wafer, wherein a shutter is used to control arrival of the evaporated silicon atoms onto the silicon wafer surface. A thickness tester is used to detect a rate of evaporation of silicon. A liquid nitrogen shroud is also used to absorb unnecessary gas molecules for emission thereof.

In the Japanese laid-open patent publication No. 5-335530, there is disclosed a method for forming a silicon on insulator substrate, which may suppress crystal defects such as slip lines as well as enable repair of crystal defects which may be caused by an oxygen ion implantation at a high dose, in addition which is capable of formation of the multi-layered silicon on insulator substrate comprising a semiconductor substrate, an insulation film overlying the semiconductor substrate and a crystal silicon layer overlying the insulation film. The insulation film is formed by oxygen ion implantation and subsequent annealing by excimer laser beam irradiation. The crystal silicon layer is then formed on the insulation film, and as required, a silicon layer is epitaxially grown on the crystal silicon layer. The above processes are repeated as required.

In the Japanese laid-open patent publication No. 5-299349, there is disclosed a method for forming a silicon on insulator substrate being thin and having an high crystal quality and less impurities. A polysilicon layer is deposited on a silicon substrate before an oxygen ion implantation into the polysilicon layer to thereby form a silicon dioxide film. A silicon layer overlying the silicon dioxide film is then subjected to a heat treatment to form a silicon on insulator substrate.

In the Japanese laid-open patent publication No. 6-37288, there is disclosed a method for forming a silicon on insulator substrate wherein an insulation film is thin and formed at a deep level from the surface of the substrate. The insulation film is formed by a high energy oxygen ion implantation and subsequent heat treatment to the substrate. A first oxygen ion implantation is carried out at an oxygen flow rate in the range of $1\times10^{15}$ ions/cm$^2$ to $1\times10^{16}$ ions/cm$^2$. Subsequently a heat treatment is carried out at a temperature in the range of 600° C. to 900° C. A second oxygen ion implantation is carried out at an oxygen flow rate in the range of $2\times10^{17}$ ions/cm$^2$ to $8\times10^{17}$ ions/cm$^2$. A final heat treatment is carried out at a temperature in the range of 1150° C. to 1400° C.

The above separation by implanted oxygen method has an advantage in relatively easy formation of the silicon on insulator substrate, but has a substantial disadvantage in an increased ion implantation time. In order to shorten the ion implantation time, it is, however, required to develop an exclusive and high performance ion implantation apparatus which is expensive. This leads to an increase in manufacturing cost of the silicon on insulator substrate thereby resulting in an increase in the price of the silicon on insulator substrate.

The foregoing conventional methods for forming the silicon on insulator substrate use the normal oxygen ion implantation, which, however, has a general problem difficulty in controlling a temperature of the substrate during the ion implantation process.

In the above circumstances, it had been required to develop a novel method for forming a silicon on insulator substrate, which is free from any disadvantages as described above.

SUMMARY OF THE INVENTION

Accordingly, it is an object of the present invention to provide a novel method for forming a silicon on insulator substrate, which is free from any disadvantages as described above.

It is a further object of the present invention to provide a novel method for forming a silicon on insulator substrate, which requires a short time for formation of the silicon on insulator substrate.

It is a still further object of the present invention to provide a novel method for forming a silicon on insulator substrate, which enables a reduction in manufacturing cost thereof.

It is another object of the present invention to provide a simple apparatus for forming a silicon on insulator substrate.

The above and other objects, features and advantages of the present invention will be apparent from the following descriptions.

The present invention provides a method for forming a silicon on insulator substrate comprising the steps as follows. A plasma dissociation of molecules including at least any one of oxygen and nitrogen is carried out to obtain ions. The ions are accelerated at a predetermined acceleration energy for irradiation of the accelerated ions onto a silicon substrate which is heated to form an insulation film within the silicon substrate.

It is preferable that the molecules comprise at least one selected from the group consisting of $O_2$ molecules and $H_2O$ molecules.

It is also preferable that a dilution gas is added to the molecules.

It is further preferable that the dilution gas is $H_2$ gas.

Alternatively, the dilution gas may be at least one inert gas selected from the group consisting of He, Ar, Kr, and Xe.

It is also preferable that the molecules comprise at least one selected from the group consisting of $N_2$ molecules and $NH_3$ molecules. In this case, a dilution gas is added to the molecules. In this case, the dilution gas may be $H_2$ gas. Alternatively, the dilution gas may be at least one inert gas selected from the group consisting of He, Ar, Kr, and Xe.

It is also preferable that the molecules comprise at least one selected from the group consisting of $N_2O$ molecules and NO molecules. In this case, a dilution gas may be added to the molecules. The dilution gas may be $H_2$ gas. Alternatively, the dilution gas may be at least one inert gas selected from the group consisting of He, Ar, Kr, and Xe.

The present invention also provides a method for forming a silicon on insulator substrate comprising the steps as follows. A simultaneous plasma dissociation of both first molecules including oxygen and second molecules including nitrogen is carried out to obtain ions. The ions are accelerated at a predetermined acceleration energy for irradiation of the accelerated ions onto a silicon substrate, and subsequent subjecting the silicon substrate to a heat treatment to form an insulation film within the silicon substrate.

It is preferable that the first molecules comprise at least one selected from the group consisting of $O_2$ molecules and $H_2O$ molecules, and the second molecules comprise at least one selected from the group consisting of $N_2$ molecules and $NH_3$ molecules. In this case, a dilution gas may be added to the molecules. The dilution gas may be $H_2$ gas. Alternatively, the dilution gas duty be at least one inert gas selected from the group consisting of He, Ar, Kr, and Xe.

The present invention further provides an apparatus for forming a silicon on insulator substrate comprising the following elements. A plasma chamber is provided for plasma dissociation of molecules including at least any one of oxygen and nitrogen to obtain ions. An accelerator is provided for accelerating the ions at a predetermined acceleration energy. An irradiator is provided for irradiation of the accelerated ions onto a silicon substrate. A heater is provided for subjecting the silicon substrate to a heat treatment during the irradiation of the accelerated ions to form an insulation film within the silicon substrate.

It is preferable that the means for plasma dissociation comprises a plasma chamber and high frequency electrodes provided on the plasma chamber for causing the plasma dissociation.

It is also preferable that the plasma chamber is made of a material which is transmittive to radio frequency waves. It is more preferable that the material is at least one selected from the group consisting of silicon oxide, silicon nitride and silicon oxide nitride.

It is also preferable that the means for accelerating the ions comprises an acceleration electrode applied with an,acceleration voltage.

It is also preferable that the means, for irradiation comprises a reaction chamber for Accommodating the silicon substrate to be irradiated with the accelerated ions thereunto. It is more preferable that the reaction chamber is coated with a material comprising at least one selected from the group consisting of silicon, silicon oxide, silicon nitride, and silicon oxide nitride. It is more preferable that the means for subjecting the silicon substrate to a heat treatment comprises a heater provided in the reaction chamber for control a temperature of the silicon substrate during irradiation.

BRIEF DESCRIPTIONS OF THE DRAWINGS

Preferred embodiments of the present invention will be described with reference to the accompanying drawings.

DISCLOSURE OF THE INVENTION

Figure 1:
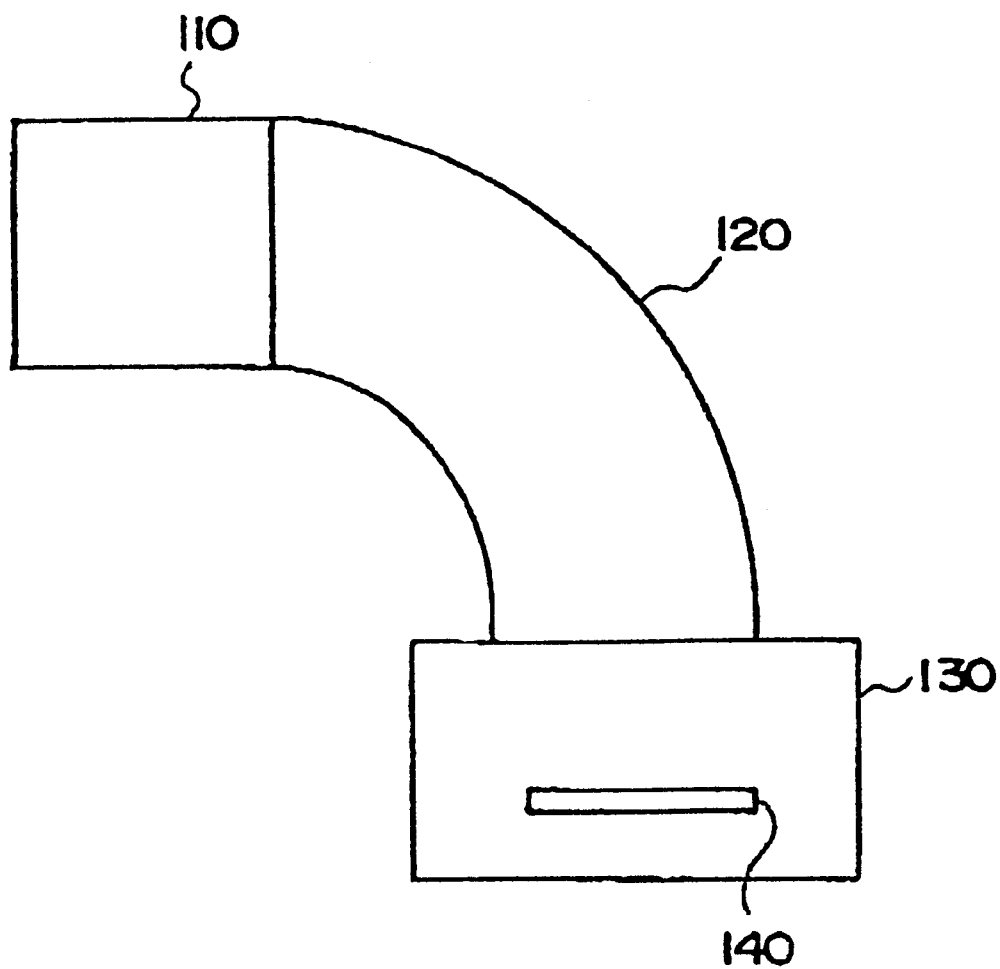
FIG. 1 is a schematic view illustrative of an ion implantation apparatus used in the conventional method for forming the silicon on insulator substrate.

The present invention provides a novel method for forming a silicon on insulator substrate as follows. A plasma dissociation of molecules including oxygen atoms into ions is carried out in a plasma chamber. The ions are subsequently accelerated by acceleration electrodes without conducting a mats separation process of the ions. The accelerated ions are then irradiated onto a silicon substrate in a reaction chamber. The silicon substrate subjected to a heat treatment to form a silicon oxide film within the silicon substrate.

In the above method, in place of the molecules including oxygen atoms, use may be made of molecules including nitrogen atoms, molecules including nitrogen atoms in combination with molecules including oxygen atoms, or molecules including both oxygen atoms and nitrogen atoms. If the molecules including nitrogen atoms are used, then a silicon nitride film is formed within the silicon substrate. If, however, the molecules including both oxygen atoms and nitrogen atoms are used, then a silicon oxide nitride film is formed within the silicon substrate. As the molecules including oxygen atoms, either $O_2$ molecules or $H_2O$ molecules are available. As the molecules including nitrogen atoms, either $N_2$ molecules or $NH_3$ molecules are available. As the molecules including both oxygen atoms and nitrogen atoms either $N_2O$ molecules or $NO$ molecules may be used. Further, a dilution gas may optionally be used to dilute the above molecules, such as an inert gas selected from the group consisting of $H_2$ or He, Ar, Kr and Xe. It is further optionally possible to control a temperature of the silicon substrate, during the ion irradiation process. In accordance with the above present invention, the oxygen ion implantation is not carried out.

The present invention provides a novel apparatus for forming a silicon on insulator substrate. The apparatus comprises a plasma dissociating section for plasma dissociation of molecules including at least any one of oxygen atoms and nitrogen atoms into ions, an accelerator for acceleration of the ions at a predetermined energy, and an irradiator for irradiation of the accelerated ions. The plasma dissociating section includes a plasma chamber for the plasma dissociation of molecules including at least any one of oxygen atoms and nitrogen atoms into ions. The accelerator may comprise acceleration electrodes for acceleration of the ions at a predetermined energy. The irradiator may include a reaction chamber for accommodating the silicon substrate to be irradiated with the accelerated ions including at least any one of oxygen ions and nitrogen ions.

It is preferable to further provide a temperature controller for controlling a temperature of the silicon substrate during the ion irradiation process.

It is also preferable that a vacuum container may be made of a material transmittive to a radio frequency electromagnetic wave, for example, silicon oxide, silicon nitride and silicon oxide nitride alone or in combination. An inner surface of the reaction chamber is coated with a protection coating wall made of a material including silicon to prevent the silicon substrate from receiving an impurity contamination.

The silicon on insulator substrate is obtained at a lower manufacturing cost because, contrary to the conventional method, in accordance with the present invention, any positive or negative ions generated by the plasma dissociation process of the source including at least either one of oxygen and nitrogen atoms are accelerated by the acceleration electrodes and irradiated onto the silicon substrate accommodated in the reaction chamber. This method is different from the conventional method in being free from the normal ion implantation which needs a mass separator. This makes the apparatus simple thereby resulting in a substantial reduction in manufacturing cost of the silicon on insulator substrate. If contrary to the present invention the mass separation process were conducted prior to the ion implantation process, then it is required that a fine beam having a small beam spot size of at most about 10×100 mm is scanned onto an entire surface of the silicon substrate for a long time. In accordance with the present invention, however, a mass separation process is not carried out. This allows a batch irradiation of ions onto a large area of the subtrate surface of the substrate. Further, the present invention is free from the problem of ion current loss caused when the mass separation process was carried out. This substantially shorten the time necessary for irradiation of ions onto a unit dose. These substantially reduce manufacturing cost of the silicon on insulator substrate.

If, for example, $O_2$ molecules are dissociated in the plasma chamber, plasma ions generated are only O+ and $O_2$+ provided that the atmosphere in the plasma chamber is kept clean. In the plasma dissociation process, it is normally possible to vary a ration of O+ ions generated to $O_2$+ ions generated by changing various parameters such as gas pressure and applied voltage level. It is, for example, possible to vary the ratio of O+ ions generated to $O_2$+ ions generated in the, range from several times to several ten of times. This means that is possible to generate the O+ ions several times of the $O_2$+ ions for subsequent irradiation thereof onto the silicon substrate at an acceleration voltage similar to that in use of the separation by implanted oxygen method, followed by a heat treatment similar to that in use of the separation by implanted oxygen method, so that the silicon on insulator substrate similar to that obtained by the separation by implanted oxygen method may be obtained by simplified processes. The $O_2$+ ions at a smaller ratio than the O+ ions do not provide electrically undesired influence on the silicon substrate. The majority part of the $O_2$+ ions generated are likely to be diffused and absorbed into the silicon dioxide film formed by the cohesion of the O+ ions in the high temperature heat treatment process after the irradiation process. Otherwise, the majority part of the $O_2$+ ions generated are likely to be diffused and discharged.

Accordingly, it is possible to form the silicon on insulator substrate with the same high quality but much lower manufacturing cost as compared to the separation by implanted oxygen method.

The above novel method for forming the silicon on insulator substrate may be carried out by use of the following apparatus.

Figure 2:
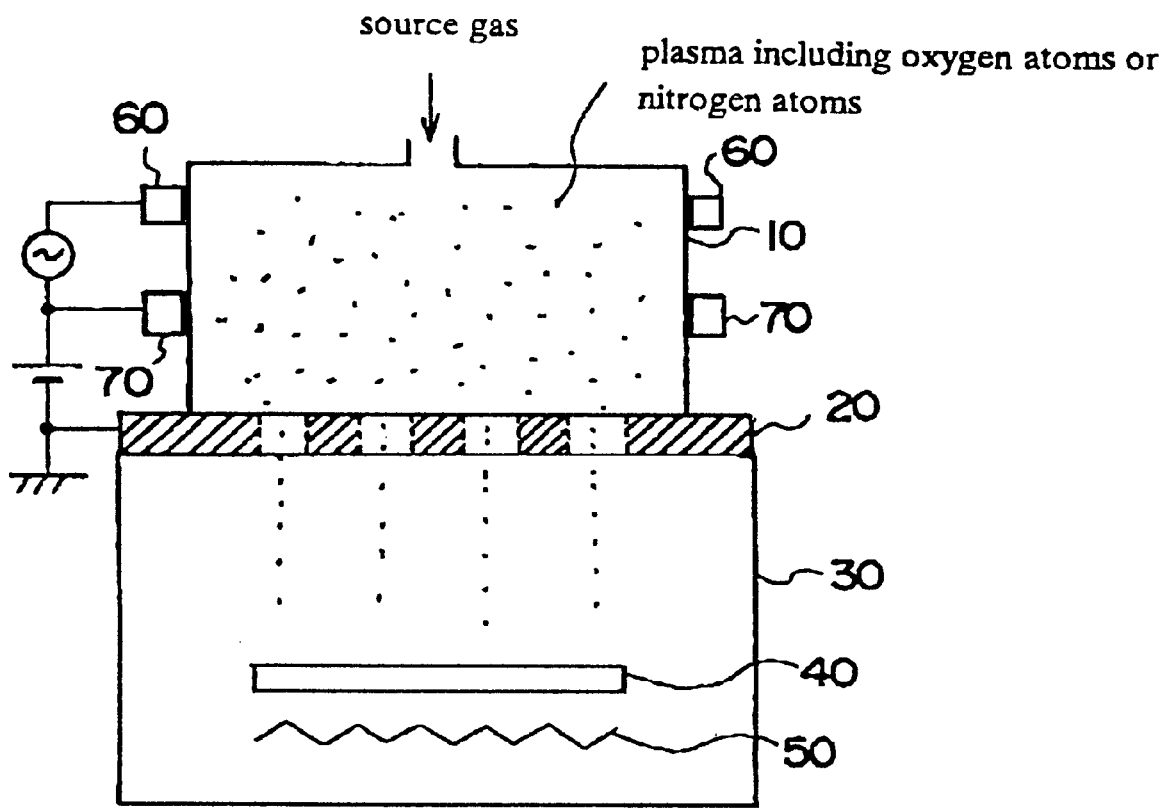
FIG. 2 is a schematic view illustrative of an apparatus used in a novel method for forming the silicon on insulator substrate in accordance with the present invention.

FIG. 2 is illustrative of the apparatus used in the novel method for forming the silicon insulator substrate in accordance with the present invention. The apparatus comprises a vacuum container 10 as a plasma chamber, acceleration electrodes 20 provided under the vacuum container 10, and a reaction chamber 30 provided under the acceleration electrodes 20 for accommodating a silicon substrate 40. A heater 50 is further provided under the silicon substrate 40 but in the reaction chamber 30 for controlling the temperature of the silicon substrate 40. The vacuum container 10 as the plasma chamber is made of a material transmittive to radio frequency waves such as silicon oxide, silicon nitride and silicon oxide nitride alone or in combination. Inner walls of the reaction chamber 30 are completely coated with silicon films or silicon plates for preventing the silicon substrate from being contaminated by an impurity, except for ions dissociated from population molecules in the plasma chamber vacuum container 10. All ions dissociated from the population molecules in the plasma chamber vacuum container 10 are accelerated in accordance with a polarity of the acceleration electrodes 20 so that positive or negative ions are irradiated onto the silicon substrate 40 in the reaction chamber 30.

It is important that the plasma chamber vacuum container 10 and the reaction chamber 30 are separated by the acceleration electrodes 20 to control the acceleration energy of ions so as to obtain an abrupt interface of the insulation film to the silicon layer overlying the insulation film. Contrary to the present invention, if the silicon substrate is, placed in the plasma chamber as used in the plasma doping process, it is difficult to control the energy of the accelerated ions thereby resulting in difficulty in obtaining an abrupt interface of the insulation film to the silicon layer overlying the insulation film.

A first embodiment according to the present invention will be described. Two of (100) silicon substrate 40 were prepared, which are of p-type and 6 inches of diameters and has a sheet resistance of 1 Ω cm to 10 Ω cm. One of the two silicon substrates 40 was placed in the ion irradiation apparatus as illustrated in FIG. 2. Irradiation of ions was carried out under the following conditions. The plasma chamber vacuum container 10 is provided with first and second ring-shaped high frequency electrodes applied with alternating current voltages at high frequency. The oxygen molecules were introduced in the plasma chamber vacuum container 10 and dissociated to obtain oxygen ions of positive polarity. The acceleration electrodes 20 were applied with an acceleration voltage in the range of 60 kV to 200 kV to accelerate the positive oxygen ions toward the silicon substrate 40 in the reaction chamber 30 for irradiation of the accelerated ions onto the silicon substrate 40, during which the silicon substrate 40 was heated by the heater 50 to control the temperature of the silicon substrate 40 in the range of room temperature to 600° C. An irradiation current was in the range of about 5 micro-A/cm$^2$ to 100 micro-A/cm$^2$. Under the above conditions, the ion irradiation was carried out for a time in the range of 20 minutes to five hours.

The silicon on insulator substrate obtained in the above processes was compared to that obtained in the conventional method, for example, the separation by implanted oxygen method using the ion implantation apparatus illustrated in FIG. 1. The two silicon on insulator substrates were subjected to a heat treatment in an argon atmosphere including 10% of oxygen molecules at a temperature of 1350° C. for four hours for detailed evaluations thereof by use of transmission electron microscope and X-ray topography method. Assuming that about 80% to 90% of all ions irradiated are O+ ions and the remaining is O$_2$+ ions, it was confirmed that the silicon on insulator structure similar to that obtained in the separation by implanted oxygen method using the ion implantation was obtained by the ion irradiation. Properties of an active silicon layer in the silicon on insulation substrate obtained in the above novel method were not inferior to that obtained in the separation by implanted oxygen method using the ion implantation. It may be considered that the excess O+ ions were discharged from the substrate or diffused into the silicon dioxide film by the heat treatment.

As described above, when the ion irradiation process was carried out, the silicon on insulator substrate having almost the same property as that obtained by the separation by implanted oxygen method was obtained by use of the ion irradiation apparatus that is much simpler than the ion implantation apparatus used in the separation by implanted oxygen method. For this reason, the cost of the apparatus was substantially reduced. When above ion irradiation method was carried out for a treating time per substrate, for example, only one half to one tenth of the treating time was needed when compared to the time necessary for the separation by implanted oxygen method. This substantially increases a throughput of the silicon on insulator substrate and reduces the manufacturing cost thereof.

For the substrate temperature during the ion irradiation, if the ion irradiation is carried out at a low acceleration energy, the substrate temperature during the ion irradiation was set at not less than 500° C. to obtain the active layer free of crystal defects. By contrast, if the separation by implanted oxygen method were used, then it is difficult to control the substrate temperature during the ion irradiation, for which reason the properties of the substrate obtained were inferior as compared to the silicon on insulator substrate.

A second embodiment according to the present invention will be described wherein in place of the oxygen molecules O$_2$, H$_2$O molecules were used. Two of (100) silicon substrate 40 were prepared, Which are of p-type and 6 inches of diameters and has a sheet resistance of 1 Ω cm to 10 Ω cm. One of the two silicon substrates 40 was placed in the ion irradiation apparatus as illustrated in FIG. 2. Irradiation of ions was carried out under the following conditions. The plasma chamber vacuum container 10 is provided with first and second ring-shaped high frequency electrodes applied with alternating current voltages at high frequency. The H$_2$O molecules were introduced in the plasma chamber vacuum container 10 and dissociated to obtain ions of positive polarity. The acceleration electrodes 20 were applied with an acceleration voltage in the range of 60 kV to 200 kV to accelerate the positive oxygen ions toward the silicon substrate 40 in the reaction chamber 30 for irradiation of the accelerated ions onto the silicon substrate 40, during which the silicon substrate 40 was heated by the heater 50 to control the temperature of the silicon substrate 40 in the range of room temperature to 600° C. An irradiation current was in the range of about 5 micro-A/cm$^2$ to 100 micro-A/cm$^2$. Under the above conditions, the ion irradiation was carried out for a time in the range of 20 minutes to five hours.

The silicon on insulator substrate obtained in the above processes was compared to that obtained in the conventional method, for example, the separation by implanted oxygen method using the ion implantation apparatus illustrated in FIG. 1. The two silicon on insulator substrates were subjected to a heat treatment in an argon atmosphere including 10% of oxygen molecules at a temperature of 1350° C. for four hours for detailed evaluations thereof by use of transmission electron microscope and X-ray topography method. Even if it was considered that the positive ions may be not only O+ ions but also OH+, H$_2$O+, H$_2$+, and H+, similar electric properties of the obtained silicon on insulator substrate were conformed, for which reason it may be considered that ions derived from most of hydrogen atoms were discharged from the substrate by the heat treatment.

It was also confirmed that if, in place of H$_2$O molecules, 62 molecules diluted with H$_2$ gas was dissociated in the plasma chamber 10, then the same ions were obtained, for which reason the same results were obtained. By varying the O$_2$ molecule concentration in the diluted gas, it is possible to set the dissociation conditions in wide ranges whereby the freedom of the manufacturing conditions for formation of the silicon on insulation substrate was increased as compared to when the $H_2O$ molecules were dissociated.

A third embodiment according to the present invention will be described. Two of (100) silicon substrate 40 were prepared, which are of p-type and 6 inches of diameters and has a sheet resistance of 1 Ω cm to 10 Ω cm. One of the two silicon substrates 40 was placed in the ion irradiation apparatus as illustrated in FIG. 2. Irradiation of ions was carried out under the following conditions. The plasma chamber vacuum container 10 is provided with first and second ring-shaped high frequency electrodes applied with alternating current voltages at high frequency. The nitrogen molecules were introduced in the plasma chamber vacuum container 10 and dissociated to obtain nitrogen ions of positive polarity. The acceleration electrodes 20 were applied with an acceleration voltage in the range of 60 kV to 200 kV to accelerate the positive nitrogen ions toward the silicon substrate 40 in the reaction chamber 30 for irradiation of the accelerated ions onto the silicon substrate 40, during which the silicon substrate 40 was heated by the heater 50 to control the temperature of the silicon substrate 40 in the range of room temperature to 600° C. An irradiation current was in the range of about 5 micro-A/cm$^2$ to 100 micro-A/cm$^2$. Under the above conditions, the ion irradiation was carried out for a time in the range of 20 minutes to five hours. A silicon nitride film was formed in the silicon substrate whereby the silicon on insulator substrate was formed. The same results were obtained as in the first embodiment.

A fourth embodiment according to the present invention will be described. Two of (100) silicon substrate 40 were prepared, which are of p-type and 6 inches of diameters and has a sheet resistance of 1 Ω cm to 10 Ω cm. One of the two silicon substrates 40 was placed in the ion irradiation apparatus as illustrated in FIG. 2. Irradiation of ions was carried out under the following conditions. $N_2O$ molecules were introduced in the plasma chamber vacuum container 10 and dissociated to obtain oxygen and nitrogen ions of positive polarity. The acceleration electrodes 20 were applied with an acceleration voltage in the range of 60 kV to 200 kV to accelerate the positive nitrogen and oxygen ions toward the silicon substrate 40 in the reaction chamber 30 for irradiation of the accelerated ions onto the silicon substrate 40, during which the silicon substrate 40 was heated by the heater 50 to control the temperature of the silicon substrate 40 in the range of room temperature to 600° C. An irradiation current was in the range of about 5 micro-A/cm$^2$ to 100 micro-A/cm$^2$. Under the above conditions, the ion irradiation was carried out for a time in the range of 20 minutes to five hours. A silicon oxide nitride film (SiON) was formed in the silicon substrate whereby the silicon on insulator substrate was formed. The same results were obtained as in the first embodiment.

As modifications, in place of positive ions, negative ion irradiation are also possible. As a dilution gas, in place of $H_2$ gas, inert gases such as He, Ai, Kr, and Xe are available. The plasma chamber vacuum container 10 is preferably made of a material transmittive to radio frequency waves such as silicon oxide, silicon nitride and silicon oxide nitride. The inner wall of the reaction chamber 30 may be coated with not only silicon oxide but also silicon nitride or silicon oxide nitride.

Whereas further modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which all within the spirit and scope of the present invention.

What is claimed is:

1. A method of forming a silicon-on-insulator substrate, comprising the steps of:

dissociating into ions, molecules that comprise at least one of oxygen and nitrogen atoms;

setting plasma conditions for the dissociating step so that the ions include first ions that will form an insulator layer within a silicon substrate having a silicon surface and that are a majority of the ions and second ions that are a minority of the ions and that are different from the first ions;

accelerating the first and second ions at a first energy using acceleration electrodes;

irradiating the silicon substrate with the accelerated first and second ions to cause the accelerated first ions to pass through the silicon surface of the silicon substrate; and heating the silicon substrate to diffuse the first ions to form the insulator layer, wherein the first ions are $O^+$ ions and the second ions are $O_2^+$ ions.

2. The method of claim 1, wherein a ratio of an amount of the first ions to an amount of the second ions exceeds two.

3. The method of claim 2, wherein the ratio exceeds ten.

4. The method of claim 1, wherein the molecules are oxygen molecules and the first ions are O+ ions and the second ions are $O_2$+ ions, and a ratio of an amount of the first ions to an amount of the second ions exceeds two.

5. The method of claim 4, wherein 80–90% of the first ions are the O+ ions and the remaining ions are the $O_2$+ ions.

6. The method of claim 1, wherein the molecules are water molecules and the first ions are O+ ions and the second ions are OH+, $H_2O$+, $H_2$+ and H+ ions.

7. The method of claim 1, wherein the molecules are nitrogen molecules.

8. The method of claim 1, wherein the molecules are $N_2O$ molecules.

9. A method of forming a silicon-on-insulator substrate, comprising the steps of:

dissociating molecules that comprise at least one of oxygen and nitrogen atoms into ions in a plasma chamber that is separated from a reaction chamber by an acceleration electrode with gaps therethrough;

setting plasma conditions of at least one of a gas pressure and an applied voltage level in the plasma chamber during the dissociating step so that the dissociated ions include first ions that will form an insulator layer wherein the first ions are $O^+$ ions and the second ions are $O_2^+$ ions within a silicon substrate having a silicon surface and that are a majority of the ions and second ions that are different from the first ions, a ratio of an amount of the first ions to an amount of the second ions being greater than two;

accelerating the first and second ions with the acceleration electrodes that are charged with an acceleration voltage as the first and second ions pass through the gaps in the acceleration electrodes directly to the reaction chamber;

irradiating the silicon substrate in the reaction chamber with the accelerated first and second ions to cause the accelerated first ions to pass through the silicon surface of the silicon substrate; and heating the silicon substrate in the reaction chamber to diffuse the irradiated first ions to form the insulator layer, wherein the first ions are $O^+$ ions and the second ions are $O_2^+$ ions.

10. The method of claim 9, wherein the ratio exceeds ten.

11. The method of claim 9, wherein the molecules are oxygen molecules and the first ions are O+ ions and the second ions are $O_2$+ ions.

12. The method of claim 11, wherein 80–90% of the first ions are the O+ ions and the remaining ions are the $O_2$+ ions.

13. The method of claim 9, wherein the molecules are water molecules and the first ions are O+ ions and the second ions are OH+, $H_2O$+, $H_2$+ and H+ ions.

14. The method of claim 9, wherein the molecules are nitrogen molecules.

15. The method of claim 9, wherein the molecules are $N_2O$ molecules.

* * * * *